United States Patent [19]

Chi et al.

[11] Patent Number: 4,721,866
[45] Date of Patent: Jan. 26, 1988

[54] CMOS CURRENT SWITCHING CIRCUIT

[75] Inventors: Kuang K. Chi, Shrewsbury; Barbara M. Sullivan, Boston, both of Mass.

[73] Assignee: Digital Equipment Corporation, Maynard, Mass.

[21] Appl. No.: 800,644

[22] Filed: Nov. 21, 1985

[51] Int. Cl.$^4$ .................. H03K 19/094; H03K 3/01; H03K 17/687
[52] U.S. Cl. .................. 307/451; 307/270; 307/584; 307/585
[58] Field of Search ............... 307/584, 585, 304, 270, 307/451

[56] References Cited

U.S. PATENT DOCUMENTS 4,590,456  5/1986  Burton et al. ................. 307/585

FOREIGN PATENT DOCUMENTS 0025720  2/1983  Japan ..................... 307/584

Primary Examiner—John Zazworsky
Assistant Examiner—M. R. Wambach
Attorney, Agent, or Firm—Cesari and McKenna

[57] ABSTRACT

A CMOS current steering switch circuit includes a switch formed of a pair of transistors of one conductivity type having a source terminal connected to a node to which a constant current source is also connected. The drain terminals of the transistors comprise the switch circuit's output terminals. The transistor's gate terminals are controlled by a pair of buffers comprising transistors of the other conductivity type that receive differential input signals that control the switch circuit. The buffers limit the voltage swings of the control signals applied to the gate terminals so that the transistors comprising the switch are not both off at the same time.

2 Claims, 1 Drawing Figure

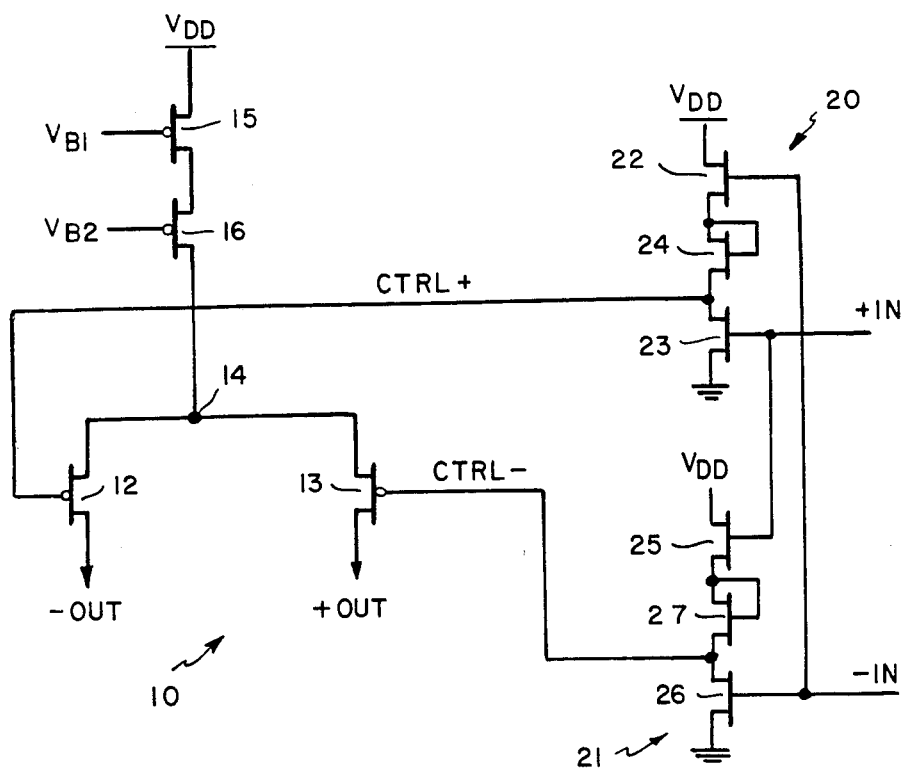

CMOS CURRENT SWITCHING CIRCUIT

BACKGROUND OF THE INVENTION

1. Field of the Invention

The invention relates generally to the field of integrated circuits comprising transistor switches connected in complementary metal-oxide-semiconductor (CMOS) and more specifically to current steering CMOS switching circuits.

2. Description of the Prior Art

Emitter-coupled logic (ECL) switching circuits have been used for a number of years in applications requiring very high speed switching. In ECL switching circuits, two bipolar transistors form the basic switch. The emitters of the transistors are connected together and are further connected to a current source. The transistors' collectors are connected through load resistors to a voltage source. The bases of the transistors are controlled by differential input signals (or, alternatively, the base of one transistor is controlled by a single input signal and the base of the other transistor is controlled by a reference voltage). The signal outputs are taken from the nodes between the load resistors and the transistor collectors.

In non-ECL switching circuits, such as conventional resistor-transistor or transistor-transistor logic switching circuits, the switching transistors switch between an on, or conducting, condition and an off, or non-conducting, condition. When the single input signal forces the switch transistor to switch from the off condition to the on condition, the transistor takes a relatively long period of time to perform the switch since parasitic capacitances in the transistor must be charged. ECL circuits reduce this lengthy turn-on period by having both transistors comprising the switch biased to remain on at all times. In ECL, the swings in the voltage levels of the logic input signals cause swings in the voltage levels of the logic output signals, but such output signals always remain at non-zero voltage levels. Since the transistors forming the switch are never turned off, the parasitic capacitances are always charged and so the switch can perform logic operations very rapidly.

ECL circuits use bipolar transistor technology, which is expensive to implement compared to metal oxide semiconductor (MOS) technology that is used in many digital integrated circuits. In addition, ECL circuits require large amounts of power to operate. However, a MOS analog to ECL logic has recently been developed in the form of current-steering logic, in which the source terminals of a pair of MOS transistors are connected together to form a node, which is further connected to a current source. The digital input signals are applied to the gate terminals of the MOS transistors, and the drain terminals are connected to a voltage source. Instead of the output signal being a change in voltage level at the output terminal, which may be the drain terminals, the output signal is taken as a change in the current directed to the output terminals; the transistors steer the current to one output terminal or the other depending on the conditions of the signals at the respective transistors' gate terminals.

Recently, CMOS technology has become popular as a way of reducing the power dissipation from that of conventional MOS circuits using P-channel or N-channel transistors exclusively. In CMOS technology, transistors are typically used in pairs. One transistor in a pair may have a P-channel and the other an N-channel, the two transistors being connected in series between a voltage source and ground with the output being taken from the node between them. If the transistors are both driven by the same logic signal, one will be on and the other off. If the transistor connected to ground is on, the voltage level of the output signal will be near ground, but if the transistor connected to the voltage source is on, the voltage level of the output signal will be near that of the voltage source.

The CMOS technology uses more space on a chip, but it significantly reduces the power dissipation of the circuit as compared to other technologies. Since only one transistor in each pair is on at one time, little current flows except when the transistors are switching. Thus power is dissipated primarily only when the transistors are switching between the on and off conditions.

As is apparent, typical CMOS circuits are voltage-sensitive, that is, logic levels are defined by voltages at the output node. However, turning the transistors on and off requires currents to flow into and out of the internal parasitic capacitances that are in both transistors in the pair, which lengthens the time required to perform the switching operation. Thus, conventional CMOS switches are much slower than ECL switches.

SUMMARY OF THE INVENTION

The invention provides a new CMOS current steering circuit that rapidly switches output voltage levels in response to the logic input signals. The circuit comprises a pair of P-channel switching transistors whose source terminals are connected together to form a node to which a current source is connected and whose drain terminals comprise the output terminals. In one embodiment, the current source is in the form of a pair of P-channel transistors connected in series between a voltage source and the node formed from the source terminals of the switching transistors. The transistors forming the current source are controlled by selected bias voltages to provide a constant current level to the node.

The gates of the switching transistors are controlled by a pair of N-channel buffers which are, in turn, controlled by differential input signals. The buffers include a pair of transistors each controlled by one of the differential input signals and provide differential control signals to the switching transistors. Each buffer further includes a load transistor to reduce the voltage swing of the control signals so as to ensure that the switching transistors are not both in the off condition at the same time when they are switching regardless of possible skew in the control signals due to possible differences between the transistors forming the buffers or differences in the arrival times of the differential input signals at the buffer. Thus the buffers ensure that a constant current always flows between the voltage source and the output terminals.

BRIEF DESCRIPTION OF THE DRAWINGS

The invention is pointed out with particularity in the appended claims. The above and further advantages of the invention may be better understood by referring to the following description taken in conjunction with the accompanying FIGURE, which depicts a schematic diagram of a circuit constructed in accordance with the invention.

DETAILED DESCRIPTION OF THE PREFERRED EMBODIMENTS

With reference to the FIGURE, a switching circuit 10 includes a pair of PMOS (P-channel) switching transistors 12 and 13 each having a source terminal that is connected to a node 14. A series-connected pair of PMOS transistors 15 and 16 is connected between a positive voltage source $V_{DD}$ and node 14. The transistors 15 and 16 are controlled by selected bias voltages, indicated in the FIGURE as $V_{B1}$ and $V_{B2}$ to supply a constant current to node 14.

Connected to the gate terminals of transistors 12 and 13 are a pair of buffer circuits 20 and 21, respectively, which are, in turn, controlled by differential input signals +IN and −IN respectively. Each buffer circuit comprises three series-connected NMOS (N-channel) transistors connected in series between the $V_{DD}$ voltage source and ground. Buffer circuit 20 includes a pull-up transistor 22 whose drain terminal is connected to the drain voltage source, a pull-down transistor 23 whose source terminal is connected to ground, and a load transistor 24 whose drain terminal is connected to the source terminal of pull-up transistor 22 and whose source terminal is connected to the drain terminal of pull-down transistor 23. The gate terminal of pull-up transistor 22 is controlled by the −IN input signal, and the gate terminal of pull-down transistor 23 is controlled by the +IN input signal. The gate terminal of the load transistor is connected to its drain terminal. The buffer output signal, a CTRL+ signal, is taken from the source terminal of the pull-down transistor, and is connected to the gate terminal of transistor 12.

The buffer 21 comprises three transistors 25, 26 and 27 connected in the same way as transistors 22, 23 and 24, respectively, except that pull-up transistor 25 is connected to receive, and is controlled by, the +IN signal and pull-down transistor 26 is connected to receive, and is controlled by, the −IN signal. The CTRL− buffer output signal, which controls transistor 13, is taken from the drain terminal of pull-down transistor 26.

The CTRL+ and CTRL− control signals control the switching transistors 12 and 13 as follows. When the CTRL+ signal from buffer 20 is at a high voltage level, which occurs when the −IN signal is at a high voltage level and the +IN signal at a low voltage level, the CTRL− signal from buffer 21 is at a low voltage level. In that condition, the transistor 12 is off, and transistor 13 is on. Since transistor 13 is on, current flows through it from node 14 and out the +OUT output terminal. Since transistor 12 is off, no current flows through it to the −OUT output terminal.

On the other hand, when the CTRL+ control signal from buffer 20 is at a low voltage level, which occurs when the +IN signal is at a high voltage level and the −IN signal is at a low voltage level, the CTRL− signal from buffer 21 is set at a high voltage level. In that condition, the transistor 12 is on and transistor 13 is off. Accordingly, current flows through transistor 12 from node 14 and out the −OUT output terminal, but no current flows through transistor 13 out the +OUT output terminal.

The buffers operate to provide control signals CTRL+ and CTRL− to control switching transistors 12 and 13 within a range to ensure that switching transistors 12 and 13 are not both off at the same time, particularly when the transistors 12 and 13 are in the process of switching between their on and off states. This may occur, for example, if the CTRL+ or CTRL− control signals are skewed because of manufacturing differences between the buffers. Skewing of the control signals would result in them not changing at precisely the same times at the gate terminals of transistors 12 and 13.

The buffers ensure that transistor 12 and 13 are not both off at the same time by providing the CTRL+ or CTRL− control signals with reduced voltage swings, and in particular, by reducing the high voltage level of both signals. Load transistors 24 and 27 operate as resistors to reduce the high voltage level of the CTRL+ and CTRL− signals. The high voltage level of the CTRL+ and CTRL− signal is approximately the $V_{DD}$ level, less the threshold voltages of two transistors, namely the transistors 22 and 24 for the CTRL+ signal, and transistors 25 and 27 for the CTRL− signal.

The circuit 10 operates as follows. When the +IN signal is at a high voltage level the −IN signal is at ground voltage level. Accordingly, the transistors 23 and 25 are both on, and transistors 22 and 26 are both off. Since transistor 23 is on, the CTRL+ control signal is at a low voltage level, essentially at the ground voltage level. Thus, transistor 12 is on, conducting current from node 14 through the −OUT output terminal.

On the other hand, the CTRL− control signal is at a high voltage level. The voltage level of the CTRL− signal is the $V_{DD}$ drain power source, reduced by the threshold voltages of transistors 25 and 27. In a typical CMOS circuit, in which the $V_{DD}$ voltage source is nominally a positive five volts, the voltage level of the CTRL− signal would be two and a half volts. With transistor 12 conducting and with a voltage drop occurring across transistors 15 and 16, the voltage level of node 14 is above zero but somewhat less than five volts, and so the voltage level of the CTRL− signal, even though only two and a half volts, is still sufficient to cut off the transistor 13, so that no current passes through the +OUT output terminal.

As the +IN input signal changes from the five volt level to a zero (ground) level, and the −IN input signal changes from a ground level to five volts, the conditions of the transistors comprising the respective buffers change. Specifically, transistors 22 and 26 turn on and transistors 23 and 25 turn off. Since transistor 22 turns on, transistor 24 also begins to turn on, the voltage level of the CTRL+ signal begins rising, which in turn begins to turn transistor 12 off.

As transistor 12 begins to turn off, the voltage level of node 14 begins to rise also. Contemporaneously, the voltage level of the CTRL− signal will decrease and turn transistor 13 on, reducing the voltage level of node 14 and providing a current path to the +OUT output terminal. If, however, the signals are skewed so that the voltage level of the CTRL+ signal rises before the CTRL− signal falls, the voltage level of the node 14 is increased by the transistor 12 being partially turned off. In that case, transistor 13 is also partially turned on and both transistors provide current paths from node 14.

It is readily apparent to those skilled in the art that the high voltage levels should be selected so that neither the CTRL+ nor the CTRL− signals, if they are both high, will be able to turn the respective transistors 12 and 13 off. If that condition is met, current flows continuously through the switching circuit 10 and so, the switching times of the circuit will be extremely fast.

It will be further apparent to those skilled in the art that the same operation occurs when the transistor 13 is initially on and transistor 12 is initially off, and the +IN and −IN signals force them to change condition. Thus, the presence of the buffer limiting the voltage level of the CTRL+ and CTRL− control signals to thereby ensure that transistors 12 and 13 are not both off at the same time, in turn ensures that current will continually flow through node 14. This in turn provides the switching circuit 10 with very fast switching times, since the parasitic capacitances present in the transistors do not have to be charged before the transistors begin conducting.

The foregoing description has been limited to a specific embodiment of this invention. It will be apparent, however, that this invention can be practiced using diverse circuitry with the attainment of some or all of the advantages of the invention. It is therefore the object of the appended claims to cover all such variations and modifications as come within the true spirit and scope of the invention.

What is claimed as new and desired to be secured by Letters Patent of the United States is:

1. A switch circuit for receiving differential input signals and transmitting output signals in response thereto comprising:

A. current steering switch means comprising two MOS transistors each including a drain terminal, the drain terminals of both said MOS transistors being connected to a current input node means, a source terminal, each source terminal of said respective MOS transistors being connected to a respective output terminal and a gate terminal, B. current source means connected to said current input node means for supplying a constant current to said current input node means; and C. a pair of buffer means each receiving one of the differential input signals and each connected to the gate terminal of one of said MOS transistors, each said buffer means generating a control signal for controlling the respective MOS transistor, each said buffer means includes pull-up transistor means having a drain terminal connected to a positive power supply, pull-down transistor means having a source terminal connected to ground, and resistor means connected between the source terminal of the pull-up transistor means and the drain terminal of the pull-down transistor means, the respective control signal being taken from the drain terminal of said pull-down transistor means, each of the differential input signals controlling the gate of the pull-up transistor means of one said buffer means and the gate of the pull-down transistor means of the other of said buffer means, the resistor means reducing the positive level of the respective control signal so that the gate-to-drain voltage levels of the MOS transistors do not turn them both off when the input signals are switching signal levels.

2. A switch circuit as defined in claim 1 wherein, in each said buffer means the resistor means comprises a transistor whose gate terminal is connected to its drain terminal, the transistor's drain terminal being connected to the source terminal of the respective buffer's pull-up transistor means and the transistor's source terminal being connected to the drain terminal of the respective buffer's pull-down transistor means.

* * * * *